United States Patent
Sakai et al.

(10) Patent No.: US 8,088,989 B2
(45) Date of Patent: Jan. 3, 2012

(54) THERMOELECTRIC CONVERSION MATERIAL AND THERMOELECTRIC CONVERSION ELEMENT

(75) Inventors: Akihiro Sakai, Osaka (JP); Tsutomu Kanno, Kyoto (JP); Kohei Takahashi, Osaka (JP); Hideaki Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 3 days.

(21) Appl. No.: 12/826,111

(22) Filed: Jun. 29, 2010

(65) Prior Publication Data

US 2011/0095390 A1    Apr. 28, 2011

Related U.S. Application Data

(63) Continuation of application No. PCT/JP2009/005565, filed on Oct. 22, 2009.

(51) Int. Cl.
*H01L 29/66* (2006.01)
*H01B 1/08* (2006.01)

(52) U.S. Cl. ...... 136/236.1; 136/238; 136/240; 136/205; 252/519.1; 252/519.15; 257/467; 257/E29.347

(58) Field of Classification Search ........ 136/236.1, 136/238, 240; 252/519.1, 519.15; 257/467, 257/E29.347
See application file for complete search history.

(56) References Cited

U.S. PATENT DOCUMENTS

| | | | | | |
|---|---|---|---|---|---|
| 4,283,752 | A | * | 8/1981 | Layton | 361/321.5 |
| 5,232,522 | A | * | 8/1993 | Doktycz et al. | 148/218 |
| 5,756,412 | A | * | 5/1998 | Lee et al. | 501/135 |
| 5,985,781 | A | | 11/1999 | Lee et al. | |
| 5,998,337 | A | * | 12/1999 | Hatta et al. | 505/236 |
| 6,133,051 | A | * | 10/2000 | Hintermaier et al. | 438/3 |
| 6,350,643 | B1 | * | 2/2002 | Hintermaier et al. | 438/240 |
| 6,713,797 | B1 | * | 3/2004 | Desrochers et al. | 257/295 |
| 2001/0041374 | A1 | * | 11/2001 | Hintermaier et al. | 438/3 |
| 2005/0081906 | A1 | * | 4/2005 | Adachi et al. | 136/238 |
| 2006/0068983 | A1 | * | 3/2006 | Okimura et al. | 501/136 |
| 2009/0015128 | A1 | * | 1/2009 | Chittka et al. | 313/346 R |
| 2010/0289383 | A1 | * | 11/2010 | Harigai et al. | 310/339 |

FOREIGN PATENT DOCUMENTS

| | | |
|---|---|---|
| JP | 9-321346 | 12/1997 |
| JP | 10-72258 | 3/1998 |
| JP | 11-35373 | 2/1999 |
| JP | 2004-43194 | 2/2004 |

OTHER PUBLICATIONS

Ferrari, et al., "Laser heated pedestal growth and optical characterization of $CaTa_2O_6$ single crystal fiber", Journal of Crystal Growth, vol. 266, pp. 475-480, Jun. 1, 2004.

(Continued)

*Primary Examiner* — Alexa Neckel
*Assistant Examiner* — Golam Mowla
(74) *Attorney, Agent, or Firm* — Hamre, Schumann, Mueller & Larson, P.C.

(57) ABSTRACT

The present invention provides a thermoelectric conversion material composed of an oxide material represented by chemical formula $A_{0.8-1.2}Ta_2O_{6-y}$, where A is calcium (Ca) alone or calcium (Ca) and at least one selected from magnesium (Mg), strontium (Sr), and barium (Ba), and y is larger than 0 but does not exceed 0.5 ($0 < y \leq 0.5$).

9 Claims, 5 Drawing Sheets

OTHER PUBLICATIONS

Sakai, et al., "Thermoelectricity for electron carrier doped $KTaO_3$", Proceedings of the Fifth Annual Meeting of the Thermoelectrics Society of Japan, p. 17, 2008.

Okuda, et al., "Large thermoelectric response of metallic perovskites: $Sr_{1-x}La_xTiO_3$ ($0 \leqq x \leqq 0.1$)", Physical Review B, vol. 63, pp. 113104-1-113104-4, Mar. 1, 2001.

* cited by examiner

PRIOR ART

FIG.5

THERMOELECTRIC CONVERSION MATERIAL AND THERMOELECTRIC CONVERSION ELEMENT

BACKGROUND OF THE INVENTION

1. Field of the Invention

The present invention relates to thermoelectric conversion materials and thermoelectric conversion elements.

2. Description of Related Art

Thermoelectric generation is a technology for directly converting thermal energy into electrical energy using the Seebeck effect, i.e. an effect of generating a thermoelectromotive force in proportion to a temperature difference by providing the temperature difference between opposite ends of a substance. This technology has been put to practical use as, for example, a remote area power supply, an outer space power supply, and a military power supply, in some fields. Furthermore, thermoelectric cooling is a technology using the Peltier effect, i.e. a phenomenon in which electrons carried by a current flow can transfer heat. Specifically, these technologies achieve electrical power generation or absorption of heat from the junction of two substances having carriers of opposite signs by utilizing the fact that when the two substances are connected with each other thermally in parallel and electrically in series and an electric current then is passed therethrough, the difference in sign between the carriers is mirrored to the difference in the direction of the heat flow. Examples of the two substances having carriers of opposite signs that can be used include a p-type semiconductor in which the electroconductive carrier is a hole and an n-type semiconductor in which the electroconductive carrier is an electron. The configuration of the above-mentioned element, which is a configuration for achieving thermoelectric generation and thermoelectric cooling, is referred to as a π-type and is the most general configuration.

Generally, the performance of a thermoelectric conversion material is evaluated by a figure of merit Z, a figure of merit ZT that is obtained by multiplying a figure of merit Z by absolute temperature to be non-dimensionalized, or an index that is referred to as a power factor PF. The figure of merit ZT is expressed as $ZT = S^2T/\rho\kappa$, where S is a Seebeck coefficient, $\rho$ is electrical resistivity, and $\kappa$ is thermal conductivity, of a substance. The larger the figure of merit ZT, the higher the thermoelectric performance. As can be understood from the formula, the conditions required for an excellent thermoelectric conversion material are low thermal conductivity and low electrical resistivity.

Currently, an effective material that is used for thermoelectric conversion elements is $Bi_2Te_3$ with an electroconductive carrier injected thereinto. Since $Bi_2Te_3$ exhibits a performance of approximately ZT=1 at ordinary temperature, it can be said that $Bi_2Te_3$ has a thermoelectric performance at a practical level. Furthermore, since $Bi_2Te_3$ allows p-type and n-type carriers to be injected easily, the above-mentioned π-type thermoelectric conversion element can be configured by injecting different carriers from each other using $Bi_2Te_3$ alone, without using two types of materials. Further, with respect to materials with complicated structures, such as compounds with skutterudite structures and clathrate compounds, for thermoelectric conversion elements, research and development is still ongoing to allow them to be used practically. However, these materials have a problem in that when used in a high temperature region, they are oxidized and thereby suffer from a deteriorated thermoelectric performance.

Recently, in order to overcome the above-mentioned problem, the use of oxide materials as thermoelectric conversion materials is attracting attention. Since oxide materials do not have the problem of deterioration in performance that is caused by oxidation even in a high-temperature environment, they are considered to be candidates for the thermoelectric conversion materials that replace, for example, $Bi_2Te_3$. Among oxide materials, a p-type oxide material composed of layered cobalt oxide has been reported to have a high Seebeck coefficient, excellent electrical conductivity, and low thermal conductivity ($\kappa$=0.5 to 3 W/mK at room temperature) that are obtained due to the distinctive crystal structure thereof and thereby to have a high thermoelectric performance (see, for example, JP 9-321346 A). Therefore, development of thermoelectric conversion materials and technical development of thermoelectric generation/Peltier devices are being made vigorously.

On the other hand, among the n-type oxide materials, perovskite structures, such as electron-carrier-doped $KTaO_3$ (see, for example, Akihiro Sakai et al., "Thermoelectric Properties of Electron-doped $KTaO_3$", Proceedings of the Fifth Annual Meeting of the Thermoelectrics Society of Japan, p. 17), $SrTiO_3$ (see, for example, T. Okuda, "Large thermoelectric response of metallic perovskites: $Sr_{1-x}La_xTiO_3$ ($0 \leq x \leq 0.1$)", Physical Review B, Mar. 1, 2001, Volume 63 113104), $CaMnO_3$, and $LaNiO_3$, as well as electron-doped ZnO having a wurtzite can be considered as candidates for the thermoelectric conversion material. Since these materials each have a relatively high thermoelectric performance, the use thereof as thermoelectric conversion materials that are paired with layered cobalt oxides in thermoelectric conversion elements is being studied.

Figure 5:
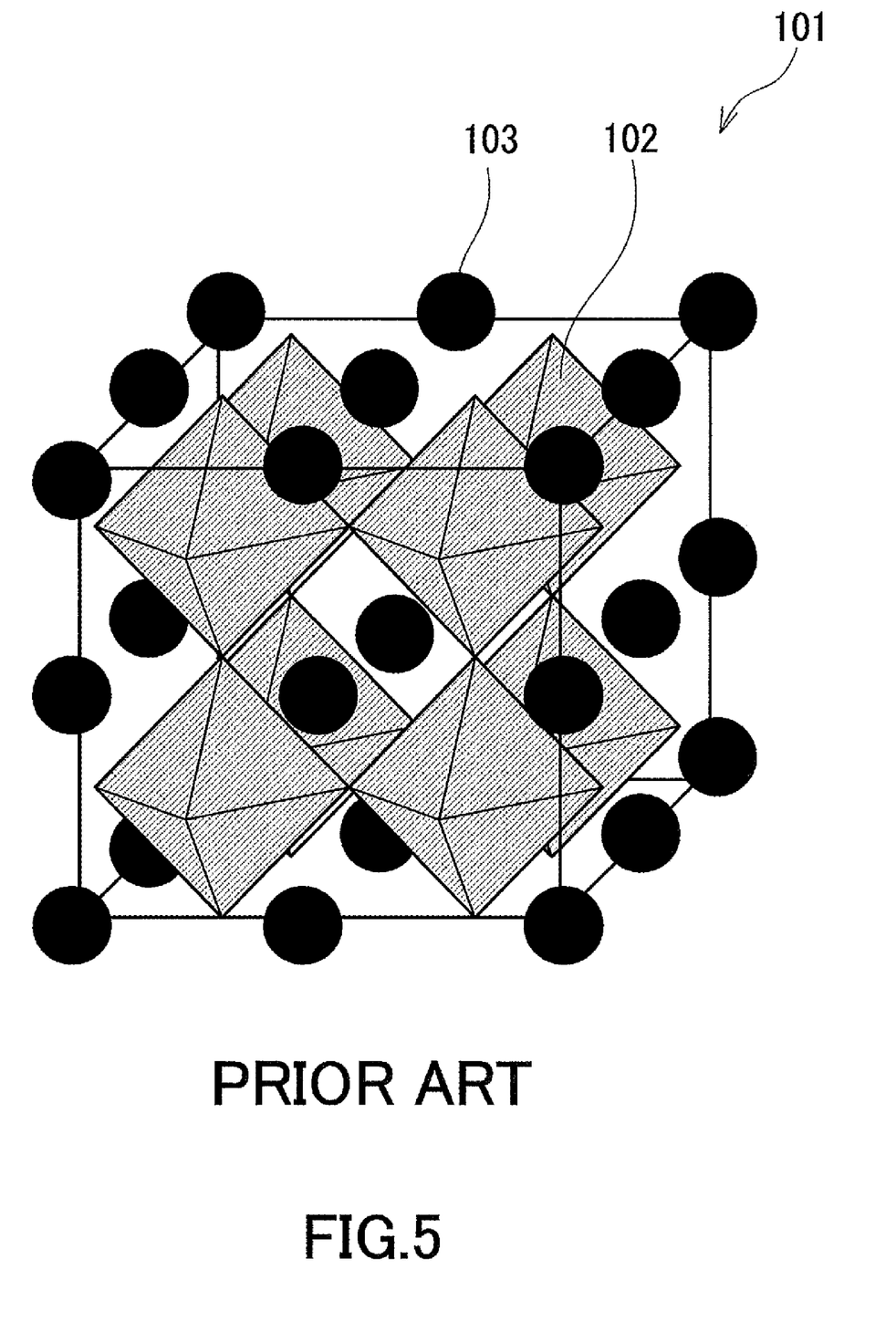
FIG. 5 is a schematic view showing the crystal structure of $KTaO_3$.

The perovskite structure typified by $KTaO_3$ or $SrTiO_3$ has an isotropic crystal structure and can have, for example, a cubic, tetragonal, or orthorhombic crystal system according to the combination of elements. The crystal structure of $KTaO_3$ is described as an example with reference to a drawing. FIG. 5 is a schematic view showing the crystal structure of $KTaO_3$. In order to make it easy to compare with the crystal structure of a thermoelectric conversion material according to the present invention described later, FIG. 5 shows a region twice as large as that defined by each crystal axis in a unit cell. That is, FIG. 5 shows eight unit cells. As shown in FIG. 5, a $KTaO_3$ crystal 101 is a cubical crystal with a lattice constant of 3.988 angstroms. Furthermore, a $(TaO_3)^{1-}$ octahedron 102 centered on tantalum (Ta) is present in the crystal structure of the $KTaO_3$ crystal 101. Besides the octahedron 102, eight potassium elements 103 are present in such a manner as to surround one octahedron 102.

However, the above-mentioned n-type oxide materials have thermal conductivities of around 5 to 50 W/mK commonly, which are relatively high. Therefore, when these materials are used for a thermoelectric conversion element, a large thermal leak occurs between a hot area and a cold area in the element, which results in a reduction in the temperature difference in the thermoelectric conversion element. This causes a problem in that the thermoelectromotive force that is generated in the thermoelectric conversion element is reduced, which results in power generation loss. In order to prevent such power generation loss, an n-type oxide material with a lower thermal conductivity is required.

SUMMARY OF THE INVENTION

The present invention was made with the above situation in mind and is intended to provide a thermoelectric conversion material that is an n-type oxide material with a lower thermal conductivity, and a thermoelectric conversion element including the same used therein.

The present inventors studied new oxide materials with respect to the above-mentioned problem and as a result, found that the above-mentioned object was achieved by the following present invention. That is, a thermoelectric conversion material according to an embodiment of the present invention is a thermoelectric conversion material composed of an oxide material represented by Chemical Formula $A_{0.8-1.2}Ta_2O_{6-y}$, where A is calcium (Ca) alone or calcium and at least one selected from magnesium (Mg), strontium (Sr), and barium (Ba), and y is larger than 0 but does not exceed 0.5.

Furthermore, a thermoelectric conversion element according to another embodiment of the present invention includes the thermoelectric conversion material as an n-type thermoelectric conversion element.

The present invention can provide a thermoelectric conversion material that is an n-type oxide material with a lower thermal conductivity, and a thermoelectric conversion element including the same used therein.

DETAILED DESCRIPTION OF THE INVENTION

Hereinafter, embodiments of the present invention are described with reference to the drawings.

Embodiment 1

The thermoelectric conversion material of the present invention is an oxide material represented by Chemical Formula $A_{0.8-1.2}Ta_2O_{6-y}$, where A is calcium alone or calcium and at least one selected from magnesium, strontium, and barium, and y is larger than 0 but does not exceed 0.5. That is, the thermoelectric conversion material is a material represented by $Ca_{0.8-1.2}Ta_2O_{6-y}$ ($0<y\leq0.5$) or a material obtained by substituting a part of calcium (Ca) of the material with at least one selected from magnesium (Mg), strontium (Sr), and barium (Ba).

Figure 1:
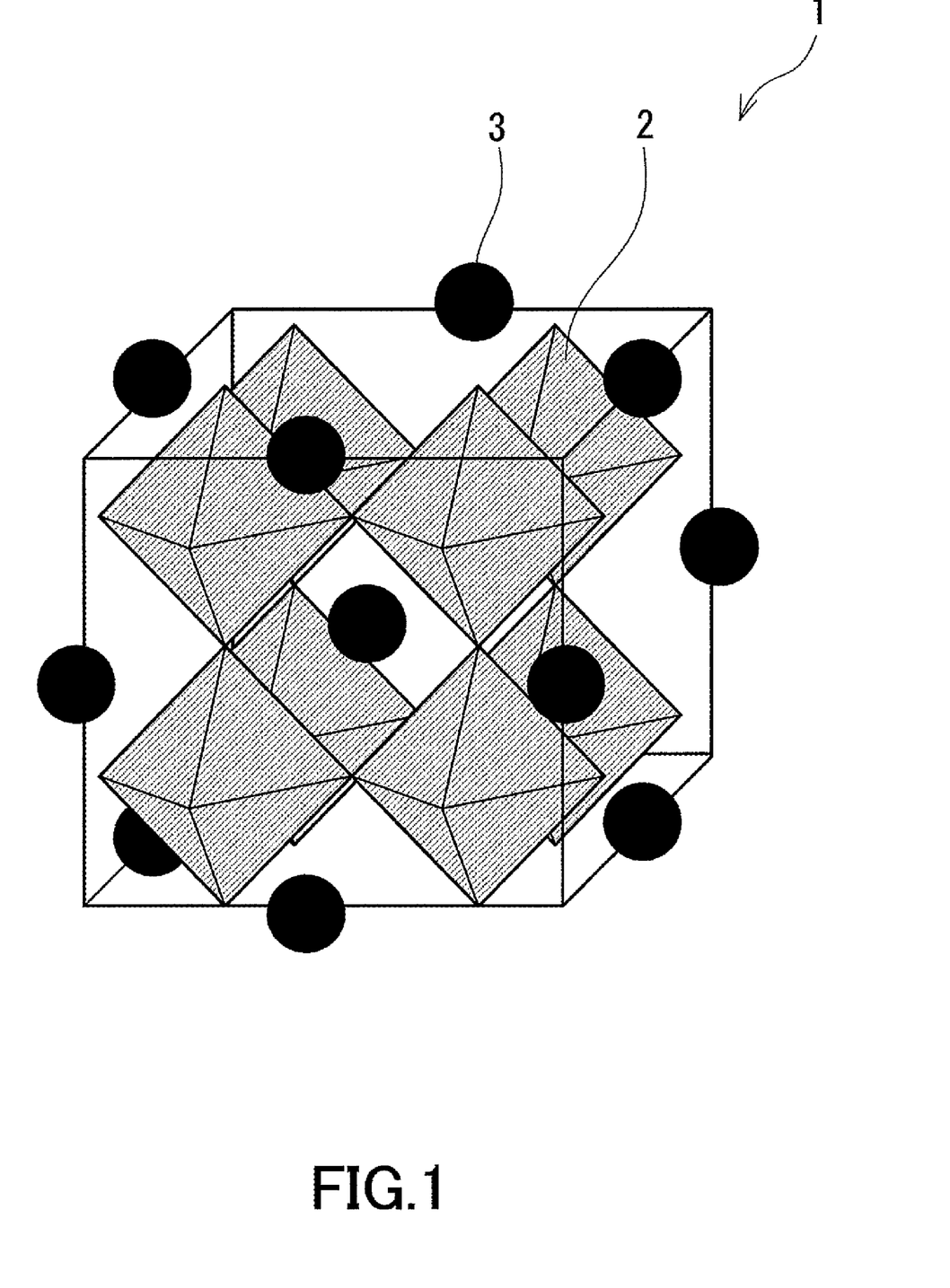
FIG. 1 is a schematic view showing an example of the crystal structure of a thermoelectric conversion material according to the present invention.

With reference to FIGS. 1 and 5, the crystal structure of the thermoelectric conversion material according to the present invention is described in contrast with the crystal structure of $KTaO_3$ that is a conventional thermoelectric conversion material. FIG. 1 is a schematic view showing the crystal structure of $CaTa_2O_{6-y}$ ($0<y\leq0.5$) that is an example of the thermoelectric conversion material according to the present invention.

As shown in FIG. 1, the $CaTa_2O_{6-y}$ ($0<y\leq0.5$) crystal 1 is a cubical crystal with a lattice constant of 7.79 angstroms and has an isotropic structure as in the case of the $KTaO_3$ crystal 101. The structure of the $CaTa_2O_{6-y}$ ($0<y\leq0.5$) crystal 1 is characterized in that as shown in FIG. 1, $(TaO_3)^{1-}$ octahedrons 2 centered on Ta are present in the structure of the $CaTa_2O_{6-y}$ ($0<y\leq0.5$) crystal 1, and besides the octahedrons 2, four calcium elements 3 are present in such a manner as to surround one octahedron 2. On the other hand, in the $KTaO_3$ crystal 101 shown in FIG. 5, eight potassium elements 103 are present around one octahedron 102. That is, the crystal structure shown in FIG. 1 has a structure in which half the number of the potassium elements 103 of the structure of the $KTaO_3$ crystal 101 is absent, and further, the remaining potassium elements are substituted by the calcium elements 3.

The $CaTa_2O_{6-y}$ ($0<y\leq0.5$) crystal is an n-type oxide material, is electrically conductive, and has a low thermal conductivity. Similarly, a material obtained by substituting a part of calcium of the $CaTa_2O_{6-y}$ ($0<y\leq0.5$) crystal 1 with at least one selected from magnesium, strontium, and barium also is electrically conductive and has a low thermal conductivity. Specifically, a thermoelectric conversion material composed of an oxide material represented by Chemical Formula $ATa_2O_{6-y}$ (where A is calcium alone or calcium and at least one selected from magnesium, strontium, and barium, and y is larger than 0 but does not exceed 0.5) is of an n-type, is electrically conductive and has a low thermal conductivity.

The present inventors carried out the synthesis of $CaTa_2O_{6-y}$, and a material obtained by substituting a part of calcium contained in $CaTa_2O_{6-y}$ with magnesium, strontium, or barium. Furthermore, the synthesis of $KTaO_3$ to serve as a comparative example also was carried out in the same manner, and the thermal and electrical conduction properties of each material were determined. As a result, it was found that a thermoelectric conversion material represented by $ATa_2O_{6-y}$ had a thermal conductivity as low as approximately 50% or lower as compared to $KTaO_3$ that is a conventional thermoelectric conversion material. It is considered that a relatively low thermal conductivity of the thermoelectric conversion material represented by $ATa_2O_{6-y}$ results from the crystal structure. $KTaO_3$ that is a conventional thermoelectric conversion material has a perovskite structure $RMO_3$ (where R and M each are a metal element). On the other hand, the crystal structure of the thermoelectric conversion material according to the present invention has a structure ($RM_2O_6$) in which half the number of R elements of the perovskite structure is absent. This is considered to be the reason for the relatively low thermal conductivity.

In the thermoelectric conversion material according to the present invention, the amount of A elements that are absent is desirably 50%. However, in the range where such a crystal structure can be maintained, even when the deficiency deviates from 50%, a low thermal conductivity can be maintained. With consideration given to this, x in $A_xTa_2O_{6-y}$ was set in the range of 1±0.2, i.e. x=0.8 to 1.2, in the present invention. More preferably, x is 0.9 to 1.1.

Preferably, the thermal conductivity of the thermoelectric conversion material according to the present invention is 50% or lower, further 30% or lower, and particularly 10% or lower, as compared to that of $SrTiO_3$ or $KTaO_3$. Specifically, judging from the values measured according to the measurement method described later, it is preferable that the thermal conductivity be lower than 5 W/mK, further 3 W/mK or lower, and particularly 1 W/mK or lower.

In the oxide material represented by $A_{1.0}Ta_2O_{6-y}$, oxygen deficiency does not exist if y is 0. Such an oxide material basically does not have an electrical conductivity and therefore cannot be used as a thermoelectric conversion material. When an oxygen deficiency is allowed to occur in the crystal, electron carriers are generated and the electrical conductivity increases drastically, which results in a higher thermoelectric performance. It is considered that not only oxygen deficiency but also substitution with a rare earth element or a trivalent cation with respect to calcium or substitution with a transition metal such as molybdenum or tungsten with respect to tantalum is useful for injecting electron carriers.

Generally, in $A_{0.8-1.2}Ta_2O_{6-y}$ that is the thermoelectric conversion material according to the present invention, it is further preferable that A be composed of a plurality of types of elements in order to reduce the thermal conductivity. The thermoelectric conversion material according to the present invention can be expected to have effects that due to the difference in crystal structure described above, not only the thermal conductivity has been reduced but also, for example, the electrical conductivity has been improved as compared to $KTaO_3$ that is a conventional thermoelectric conversion material.

The thermoelectric conversion material according to the present invention can be used in the form of a polycrystalline/single-crystal bulk or thin film. Since the polycrystalline bulk body or thin film has non-aligned crystal orientation, it has a lower electrical conductivity but it has a lower thermal conductivity. Furthermore, the polycrystalline bulk body is particularly easy to produce. The single-crystal bulk body or thin film can achieve a low electrical resistivity. The thermoelectric conversion material according to the present invention may contain trace impurities depending on the type and purity of the raw materials as well as production conditions. However, the performance thereof hardly is affected thereby as long as the impurity concentration is lower than 5 mol %.

Next, a method of producing a thermoelectric conversion material according to the present invention is described. Here, the case where a thermoelectric conversion material according to the present invention is produced in the form of a single crystal is described as an example.

Specifically a thermoelectric conversion material according to the present invention that is composed of a single crystal can be obtained by melting an oxide containing an A element and tantalum and carrying out crystal growth. Examples of the raw materials include calcium carbonate and ditantalum pentoxide. These raw materials are starting materials that are used for producing $CaTa_2O_{6-y}$, but a suitable selection of the metal element contained in the raw materials makes it possible to produce a thermoelectric conversion material according to the present invention other than $CaTa_2O_{6-y}$.

The method of producing $CaTa_2O_{6-y}$ from these raw materials is preferably a solid phase reaction method. In this case, it is preferable that the baking condition be set at 1000 to 1400° C. The baking atmosphere to be employed herein may be, for example, the air, oxygen, or an inert gas such as argon. Preferably, the synthesis of $CaTa_2O_{6-y}$ by the solid phase reaction method is carried out in a reducing atmosphere under a flow of an inert gas such as argon or an oxygen reduction gas such as a hydrogen-containing argon gas. Accordingly, an oxygen deficiency occurs and a raw material with an electrical conductivity can be produced.

Next, crystal synthesis is carried out using $CaTa_2O_{6-y}$ that is a starting material obtained by the above-mentioned solid phase reaction method. Examples of the crystal synthesis method include a self-flux method, a floating zone method, and a pulling method such as a Czochralski method. Among these, an infrared heating-type floating zone method allows a crystal to be obtained relatively easily.

When the floating zone method is used, the starting material needs to be molded into a rod shape before crystal growth is carried out. Therefore, the starting material is molded into a rod shape (for example, Ø 5 mm (diameter)×50 mm (length)) using a hydraulic hand press machine, which then is baked. In this process, baking is carried out just below the melting point, i.e. around 1300 to 1500° C. Desirably, the starting material that has been baked has obtained sufficiently high mechanical strength. Furthermore, the baking atmosphere to be employed is desirably an inert gas such as argon or an oxygen reduction gas such as a hydrogen-containing argon gas.

In the floating zone method, the speed at which the rod-shaped starting material is moved downward is required to be a speed at which a melt moves stably. Specifically, it is desirable to move the rod-shaped starting material downward at around 10 to 20 mm/Hr. Furthermore, in producing a sample with a high electrical conductivity, crystal growth in an inert gas or oxygen reducing atmosphere is required. As described above, the use of the floating zone method allows a single crystal $CaTa_2O_{6-y}$ to be obtained.

The thermoelectric conversion material according to the present invention is an n-type oxide material and has a low thermal conductivity. Accordingly, as compared to the case where a conventional n-type thermoelectric material is used, a higher temperature difference can be obtained reliably and therefore it is useful as a thermoelectric conversion material.

In determining the thermal and electrical physical properties and power generation properties of the thermoelectric conversion material according to the present invention produced by the above-mentioned method, it is necessary to provide the thermoelectric conversion material with metals or electroconductive oxide electrodes to achieve a good electrical contact. In order to achieve this, metals such as gold or silver can be provided for a sample (a thermoelectric conversion material) as electrodes to be produced thereon. In this case, it is desirable to form a layer of aluminum, titanium, or tantalum to serve as an adhesive layer between each electrode and the sample.

Embodiment 2

Figure 2:
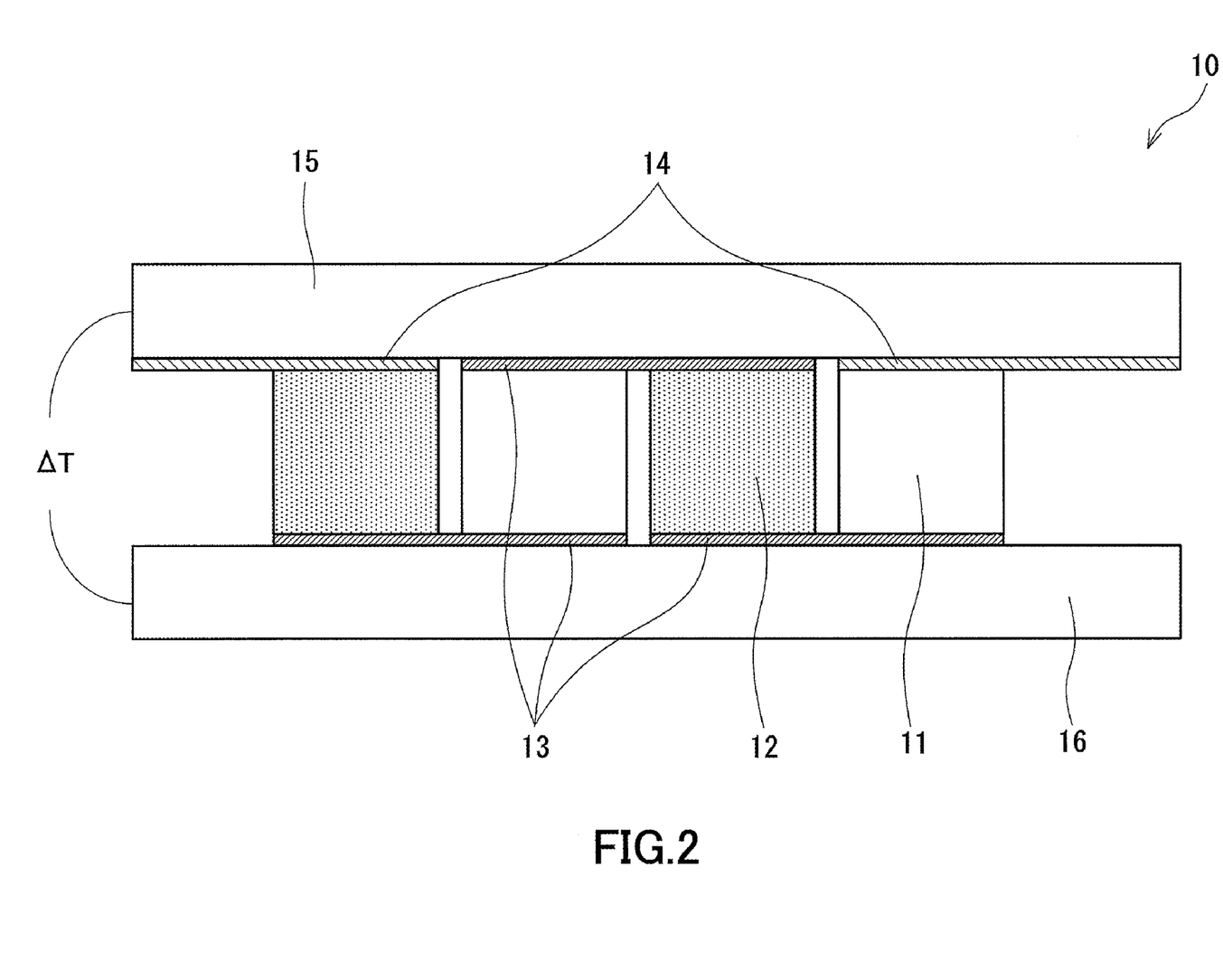
FIG. 2 is a cross-sectional view for explaining an example of the configuration of the thermoelectric conversion element according to the present invention.

FIG. 2 is a cross-sectional view for explaining an example of the configuration of a thermoelectric conversion element according to the present invention. As shown in FIG. 2, the thermoelectric conversion element 10 according to the present invention includes a plurality of n-type thermoelectric conversion materials 11 and a plurality of p-type thermoelectric conversion materials 12 according to the present invention. The n-type thermoelectric conversion materials 11 and the p-type thermoelectric conversion materials 12 are disposed on the same plane and are connected alternately to one another electrically in series. Furthermore, the thermoelectric conversion element 10 includes interconnecting electrodes 13 and extracting electrodes 14 for extracting an electromotive force to the outside. The interconnecting electrodes 13 each are in contact with each of a pair of n-type thermoelectric conversion material 11 and p-type thermoelectric conversion material 12 and electrically connect the thermoelectric conversion materials 11 and 12 to each other. The extracting electrodes 14 are connected to the n-type thermoelectric conversion material 11 or the p-type thermoelectric conversion material 12 at both ends of a series-connected body formed of thermoelectric conversion materials 11 and 12 that are connected alternately to one another through the interconnecting electrodes 13.

As described in Embodiment 1, the n-type thermoelectric conversion materials 11 each are an n-type oxide material represented by Chemical Formula $A_{0.8-1.2}Ta_2O_{6-y}$. Such n-type thermoelectric conversion materials 11 each do not deteriorate in performance due to oxidation even in a high-temperature environment and have high electroconductive properties and low thermal conduction properties.

Since it is desirable that, for example, the p-type thermoelectric conversion materials 12 do not deteriorate in performance due to oxidation even in a high-temperature environment, they are preferably oxides. The p-type thermoelectric conversion materials 12 are preferably layered cobalt oxides with a high thermoelectric performance.

The interconnecting electrodes 13 and the extracting electrodes 14 are not limited as long as they are metals, and Cu, Au, Ag, or Al can be used therefor.

Again, with reference to FIG. 2, the configuration of the thermoelectric conversion element 10 is described. A pair of n-type thermoelectric conversion material 11 and p-type thermoelectric conversion material 12 that are connected to each other through an interconnecting electrode 13 are disposed on the surface of the interconnecting electrode 13 that connects the thermoelectric conversion materials 11 and 12 to each other. A hot body 15 and a cold body 16 are placed on the upper and lower sides of the thermoelectric conversion element 10, respectively. The n-type thermoelectric conversion materials 11 and the p-type thermoelectric conversion materials 12 are connected to the hot body 15 at first ends thereof through an interconnecting electrode 13 and are connected to the cold body 16 at the other ends thereof through the interconnecting electrodes 13. The series-connected body that includes the n-type thermoelectric conversion materials 11, the p-type thermoelectric conversion materials 12, the interconnecting electrodes 13, and the extracting electrodes 14 is disposed between the opposed surfaces of the hot body 15 and the cold body 16. When the hot body 15 and the cold body 16 are allowed to have desired temperatures, respectively, a temperature difference $\Delta T$ can be generated in the vertical direction shown in the drawing of the thermoelectric conversion element 10. The hot body 15 and the cold body 16 are members to serve as, for example, a high-temperature heat sink and a low-temperature heat sink, respectively. This allows an electromotive force to be generated in each thermoelectric conversion material 11 and each p-type thermoelectric conversion material 12. Thus, electrical power can be extracted to the outside of the thermoelectric conversion element 10 through the extracting electrodes 14. Although the thermoelectric conversion element 10 shown in FIG. 2 includes two each of the n-type thermoelectric conversion materials 11 and p-type thermoelectric conversion materials 12, an increase in the number thereof increases the electromotive force of the thermoelectric conversion element 10 accordingly.

The thermoelectric conversion element 10 is a π-type thermoelectric conversion element configured using the n-type thermoelectric conversion materials 11 and p-type thermoelectric conversion materials 12 with a high thermoelectric performance. This allows the thermoelectric conversion element 10 to have highly efficient power generation properties.

EXAMPLES

Hereinafter, further specific examples of the present invention are described in contrast with comparative examples.

Example 1 and Comparative Example 1

The thermoelectric conversion material of Example 1 was a single crystal $CaTa_2O_{6-y}$ and was produced by the infrared concentration heating-type floating zone method.

First, calcium carbonate and ditantalum pentoxide that were used as raw materials were weighed to have a molar ratio of 1:1 and then were mixed together. Further, this was baked in an argon stream at 1400° C. for 20 hours (the solid phase reaction method). Subsequently, the powder obtained by the above-mentioned solid phase reaction method was formed into a cylindrical rod shape. This then was baked again in an argon stream at 1400° C. for 20 hours. Using the material rod thus obtained, crystal synthesis was carried out by the infrared concentration heating-type floating zone method. In this floating zone method, a production condition was used in which a melt was moved in an argon stream containing hydrogen (3%) at 10 mm/Hr.

Figure 3:
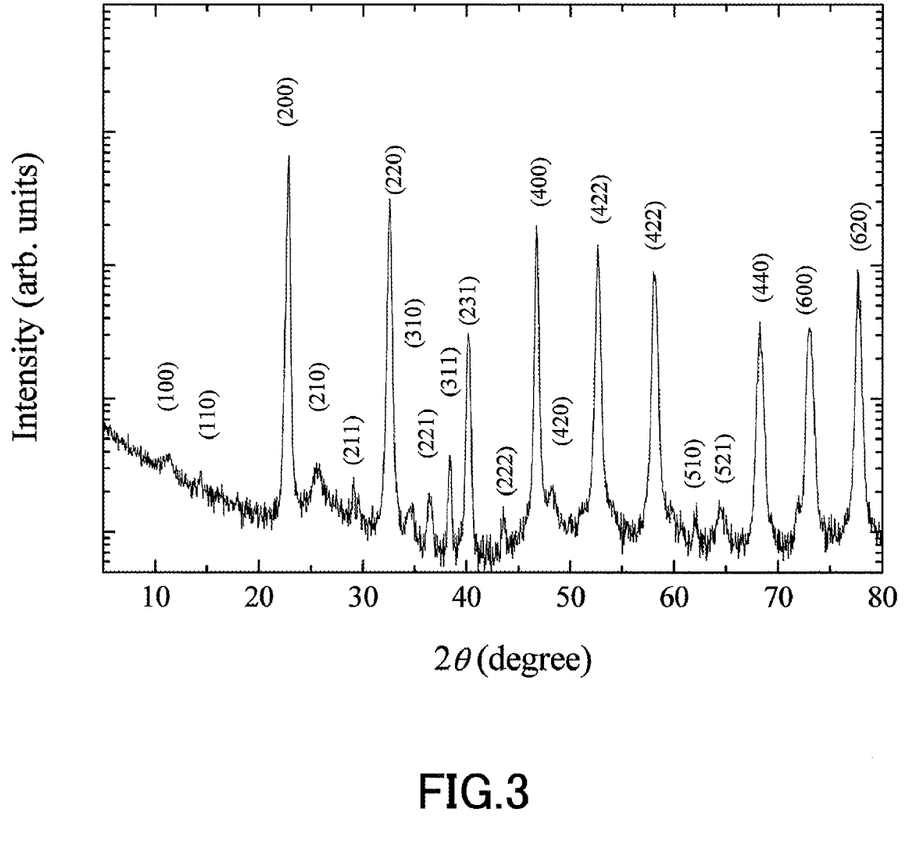
FIG. 3 is a graph showing the X-ray diffraction pattern obtained from Example 1.

The sample ($CaTa_2O_{6-y}$) thus obtained was subjected to structural evaluation by powder X-ray diffraction. As a result, similar peak patterns were observed in a plurality of measurement samples that were produced. FIG. 3 shows the X-ray diffraction pattern obtained from Example 1. As shown in FIG. 3, indexing was possible at almost all peaks. Thus, the samples produced herein were confirmed to be of single phase.

Next, the thermoelectric conversion material of Comparative Example 1 is described. The thermoelectric conversion material of Comparative Example 1 was a single crystal $KTaO_{3-z}$ and was produced using the flux method. Potassium carbonate ($K_2CO_3$) with a melting point of 1080° C. was used for the flux in the synthesis, and the crucible used herein was a platinum crucible.

Figure 4:
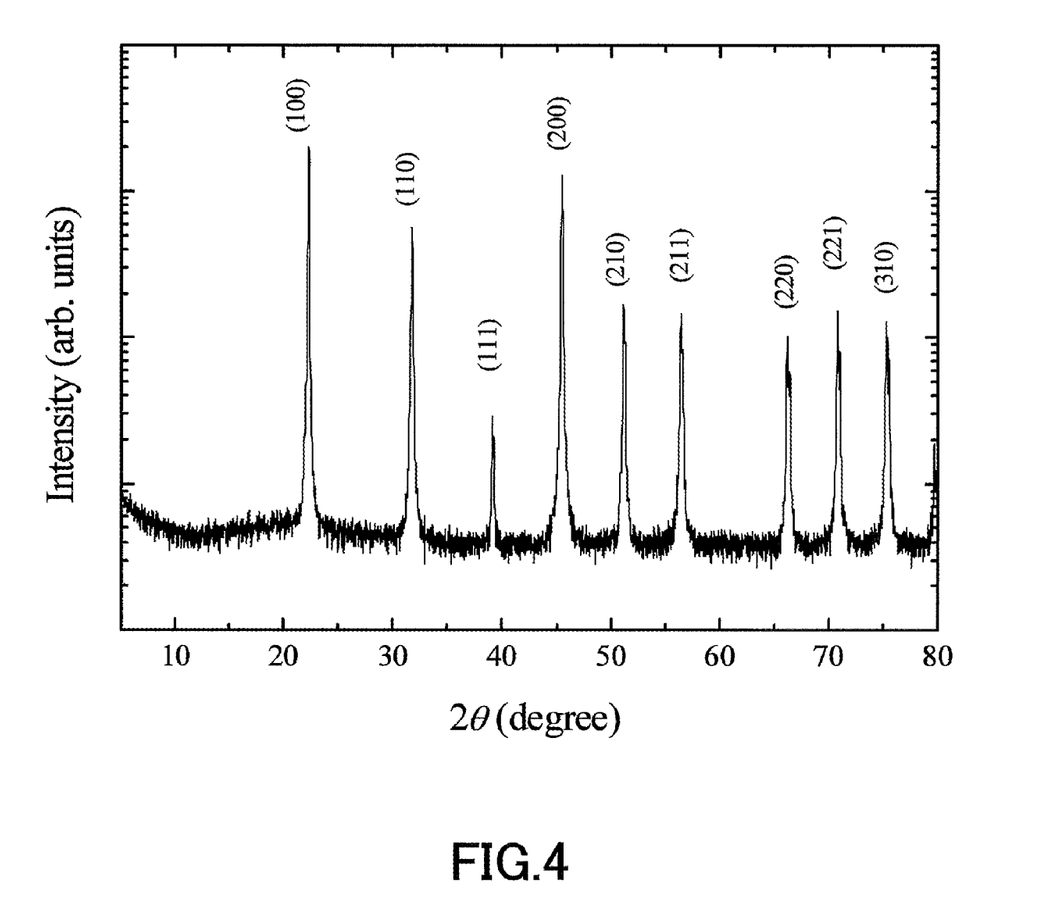
FIG. 4 is a graph showing the X-ray diffraction pattern obtained from Comparative Example 1.

First, $KTaO_3$ powder and $K_2CO_3$ powder that had been synthesized by the solid phase reaction method beforehand were weighed to have a molar ratio of 1:1.7 and then were mixed together. This was baked in an electric furnace at 800° C. After baking, the powders were mixed again and then were placed in the platinum crucible. This was heated in an argon stream containing hydrogen (3%) to 1400° C. over ten hours, was maintained at the same temperature for two hours, and then was cooled gradually to 1080° C. over 48 hours. Thus, crystal synthesis of the above-mentioned mixed material was carried out. Thereafter, it was cooled to room temperature over ten hours, and the flux then was removed with running water. Thus, crystals were obtained. Among the crystals thus obtained, larger ones had a size of approximately 10×10×5 mm$^3$, which was a sufficient size for evaluating the thermoelectric performance thereof. The resultant sample ($KTaO_{3-z}$, 0<z<3) was subjected to structural evaluation by the powder X-ray diffraction. As a result, similar peak patterns were observed in the respective plural samples that were produced. FIG. 4 shows the X-ray diffraction pattern obtained from Comparative Example 1. As shown in FIG. 4, indexing was possible at almost all peaks. Thus, the samples produced herein were confirmed to be of single phase. $CaTa_2O_{6-y}$ of Example 1 and $KTaO_{3-z}$ that is the thermoelectric conversion material of Comparative Example 1 are of single phase.

With respect to the thermoelectric conversion material of Example 1 and the thermoelectric conversion material of Comparative Example 1 that were produced by the above-mentioned methods, thermal and electrical conduction properties thereof were evaluated. First, the measurement of the electrical resistivity is described. A four-terminal method was used for the measurement of the electrical resistivity. The samples of the thermoelectric conversion materials were cut using a precision cutting machine and then ground with sandpaper until they had a desired size. The typical sample size obtained after grinding was approximately 5×2×0.5 mm$^3$, and the samples thus shaped were used to measure the electrical resistivity. Furthermore, for the measurement, electrodes were formed on the samples that had been shaped. The electrodes were, specifically, gold electrodes with aluminum used as an adhesive layer and were formed on the samples using the sputtering method.

Next, measurements of the Seebeck coefficient and thermal conductivity are described. The measurement methods used herein were steady state methods. First, the samples that were the thermoelectric conversion materials each were cut using a precision cutting machine and then were shaped. Thereafter, gold electrodes with aluminum to serve as an adhesive layer were formed on the upper surface and the bottom surface of each sample in order to extract electrical signals. The typical shape of the samples that had been shaped was a cylinder and it had, specifically, a size of approximately Ø 5 mm (diameter)×5 mm (height). The sample that had been shaped was placed on a measuring jig. The measuring jig fixes the sample and generates a temperature difference in the sample. First, the sample that had been shaped was fixed onto a flat copper plate of the measuring jig by using a silver paste that was cured at ordinary temperature, and further a flat copper plate of the measuring jig was fixed to and placed on the upper surface of the sample. The gold electrode formed on the upper surface of the sample was connected to the heater and the high-temperature side thermometer through a lead bar and the flat plate, while the gold electrode formed on the bottom surface of the sample was connected to the thermal bath and the low-temperature side thermometer through a lead bar and the flat plate. In this measuring jig, a heat generated in the heater flows into the sample through the lead bar located on the upper side, and the heat from the sample is absorbed by the thermal bath located on the lower side through the lead bar in a similar manner. The temperatures of the upper and lower portions of the sample can be read with the thermometers and the temperature difference in the sample can be monitored continuously. Since the lead bars were connected electrically to the upper and lower surfaces of the sample, electrical signals from the sample also can be obtained through the lead bars. The Seebeck coefficient can be determined if the temperature difference and electromotive forces in the vicinities of the places that are subjected to the measurement with the thermometers are determined.

Thermal conductivity is a physical quantity that is proportional to the cross-sectional area and temperature gradient and inversely proportional to the length with respect to the direction of a heat flow. Accordingly, in order to measure the thermal conductivity, the heater is used to generate a heat flow in the sample, and then the heat flow is standardized by the cross-sectional area, length, and temperature difference of the sample between the thermometers located on the high-temperature side and the low-temperature side. Furthermore, when heat emission from the measuring jig and the sample through the surrounding gas increases, accurate thermal conductivity cannot be measured. Therefore, the measurement was carried out in a vacuum of approximately $10^{-4}$ torr so that heat was prevented from escaping from the measuring jig and the sample surface as much as possible.

Finally, with respect to each of the thermoelectric conversion materials of Example 1 and Comparative Example 1, the amount of oxygen deficiency was estimated. Specifically, on the assumption that the electron carriers that had been generated were produced due to oxygen deficiency, the amount of deficiency was estimated through measurement of the number of the carriers that was carried out using the Hall effect. The four-terminal method was used for measuring the Hall effect. The electrodes formed on the samples to be used for the measurement each were a gold electrode with aluminum used as an adhesive layer. The gold electrodes were formed using the sputtering method. As a result, it was found that the thermoelectric conversion material of Example 1 had a deficiency of approximately 3% (y≈0.2; $CaTa_2O_{5.8}$) and the thermoelectric conversion material of Comparative Example 1 had a deficiency of approximately 0.5% (z≈0.01; $KTaO_{2.99}$).

Table 1 indicates the absolute values (measured values) of thermal conductivities of the thermoelectric conversion material of Example 1 and the thermoelectric conversion material of Comparative Example 1. Table 1 indicates that the thermal conductivity of Example 1 was reduced to approximately 7% as compared to the thermal conductivity of Comparative Example 1.

TABLE 1

| | Thermal Conductivity (W/mK) |
|---|---|
| Example 1 ($CaTa_2O_{5.8}$) | 0.9 |
| Comparative Example 1 ($KTaO_{2.99}$) | 13 |

Furthermore, the thermoelectric conversion material of Example 1 had an electrical resistivity of approximately 5 mΩcm and a Seebeck coefficient of approximately 100 μV/K at ordinary temperature, which was approximately 0.03 at room temperature in terms of ZT. It was found that this value was a value (ZT≈0.03) comparable to that of $KTaO_{2.99}$ that is the thermoelectric conversion material of Comparative Example 1. As described above, it was found that the thermoelectric conversion material of Example 1 had a ZT comparable to that of the thermoelectric conversion material of Comparative Example 1, which was of a perovskite type, and the thermal conductivity thereof was reduced significantly.

Example 2 and Comparative Example 2

The thermoelectric conversion material of Example 2 was polycrystalline $CaTa_2O_{6-y}$, and was produced by the solid phase reaction method.

First, calcium carbonate and ditantalum pentoxide that were used as raw materials were weighed to have a molar ratio of 1:1 and then were mixed together. Further, this was baked in an argon stream at 1000° C. for 20 hours. Subsequently, the powders obtained by the above-mentioned baking were mixed together and the mixture then was molded into a disk shape under pressure. This then was baked again in an argon stream containing hydrogen (3%) at 1400° C. for 20 hours. Thereafter, it was cooled rapidly at room temperature and thus, the thermoelectric conversion material ($CaTa_2O_{6-y}$) of Example 2 was produced. Then, the sample that was the thermoelectric conversion material of Example 2 was subjected to structural evaluation by powder X-ray diffraction. As a result, a similar peak pattern to that of the thermoelectric conversion material of Example 1 (see FIG. 3) was observed in the sample that was produced herein. Thus, the sample produced herein was confirmed to be of single phase. Moreover, the value y was determined in the same manner as in Example 1. As a result, it was confirmed that y=0.2 ($CaTa_2O_{5.8}$).

Next, the thermoelectric conversion material of Comparative Example 2 is described. The thermoelectric conversion material of Comparative Example 2 is polycrystalline $KTaO_{3-z}$ (0<z<3). The method of producing it is described. First, potassium carbonate and ditantalum pentoxide that were used as raw materials were weighed to have a molar ratio of 1:1 and then were mixed together. Further, this was baked in an argon stream at 1000° C. for 20 hours. Subsequently, the powder obtained by the above-mentioned baking was molded into a disk shape under pressure. This then was baked again in an argon stream containing hydrogen (3%) at 1100° C. for 20 hours. Thus, the thermoelectric conversion material ($KTaO_{3-z}$) of Comparative Example 2 was produced. Then, the sample that was the thermoelectric conversion material of Comparative Example 2 was subjected to structural evaluation by powder X-ray diffraction. As a result, a similar peak pattern to that of Comparative Example 1 (see FIG. 4) was observed. Thus, the sample produced herein was confirmed to be of single phase. Moreover, the value z was determined in the same manner as described above. As a result, it was confirmed that z=0.01 ($KTaO_{2.99}$).

With respect to the thermoelectric conversion material of Example 2 and the thermoelectric conversion material of Comparative Example 2 that were produced above, the thermal conductivities thereof were measured by the same method as in Example 1. The result is indicated in Table 2. Table 2 indicates the absolute values (measured values) of thermal conductivities of the thermoelectric conversion material of Example 2 and the thermoelectric conversion material of Comparative Example 2. Table 2 indicates that the thermal conductivity of Example 2 was reduced to approximately 8% as compared to the thermal conductivity of Comparative Example 2.

TABLE 2

| | Thermal Conductivity (W/mK) |
|---|---|
| Example 2 ($CaTa_2O_{5.8}$) | 0.5 |
| Comparative Example 2 ($KTaO_{2.99}$) | 6 |

As described above, it was found that the thermoelectric conversion material of Example 2 had a thermal conductivity that was reduced significantly as compared to that of the thermoelectric conversion material of Comparative Example 2, which was of a perovskite type.

Example 3 (Examples 3-1 to 3-3) and Comparative Example 3

The thermoelectric conversion material of Example 3-1 was a single crystal $Ca_{0.9}Sr_{0.1}Ta_2O_{6-y}$ and was produced by the infrared concentration heating-type floating zone method.

First, calcium carbonate, strontium carbonate, and ditantalum pentoxide that were used as raw materials were weighed to have a molar ratio of 0.9:0.1:1 and were then mixed together. Further, this was baked in an argon stream at 1400° C. for 20 hours (the solid phase reaction method). Subsequently, the powder obtained by the above-mentioned solid phase reaction method was formed into a cylindrical rod shape. This then was baked again in an argon stream at 1400° C. for 20 hours. Using the material rod thus obtained, crystal synthesis was carried out by the infrared concentration heating-type floating zone method. In the floating zone method, crystals were produced, with a melt being scanned in an argon stream at 10 mm/Hr. Then, the samples ($Ca_{0.9}Sr_{0.1}Ta_2O_{5.8}$) thus obtained were subjected to structural evaluation by powder X-ray diffraction. As a result, similar peak patterns were observed in the respective samples. Furthermore, indexing was possible at almost all peaks. Thus, the samples produced herein were confirmed to be of single phase. Moreover, the value y was determined in the same manner as described above and it was confirmed that y=0.2 ($Ca_{0.9}Sr_{0.1}Ta_2O_{5.8}$).

Next, a single crystal $Ca_{0.9}Ba_{0.1}Ta_2O_{5.8}$ was produced as a thermoelectric conversion material of Example 3-2 by the infrared concentration heating-type floating zone method. The method of producing it was the same as that of producing the thermoelectric conversion material of Example 3-1 described above.

Next, a single crystal $Ca_{0.9}Mg_{0.1}Ta_2O_{5.8}$ was produced as a thermoelectric conversion material of Example 3-3 by the infrared concentration heating-type floating zone method. The method of producing it was the same as that of producing the thermoelectric conversion material of Example 3-1 described above.

Furthermore, a thermoelectric conversion material of Comparative Example 3 that was used to be compared with the thermoelectric conversion materials of Examples 3-1 to 3-3 was the thermoelectric conversion material of Comparative Example 1 described above that was compared with Example 1.

With respect to the thermoelectric conversion materials of Examples 3-1 to 3-3 and the thermoelectric conversion material of Comparative Example 3 produced above, thermal conductivities thereof were measured by the same method as in Example 1. The result is indicated in Table 3. Table 3 indicates the absolute values (measured values) of thermal conductivities of the thermoelectric conversion materials of Examples 3-1 to 3-3 and the thermoelectric conversion material of Comparative Example 3. Table 3 indicates that in the thermoelectric conversion materials according to the present invention, even in the case of using materials in which a part of calcium was substituted by strontium, barium, or magnesium, the thermal conductivity was reduced as compared to the thermal conductivity of Comparative Example 3.

TABLE 3

| | Thermal Conductivity (W/mK) |
|---|---|
| Example 3-1 ($Ca_{0.9}Sr_{0.1}Ta_2O_{5.8}$) | 0.8 |
| Example 3-2 ($Ca_{0.9}Ba_{0.1}Ta_2O_{5.8}$) | 0.8 |
| Example 3-3 ($Ca_{0.9}Mg_{0.1}Ta_2O_{5.8}$) | 0.8 |
| Comparative Example 3 ($KTaO_{2.99}$) | 13 |

As described above, it was found that the thermoelectric conversion materials of Example 3 had thermal conductivities that were reduced significantly as compared to that of the thermoelectric conversion material of Comparative Example 3, which was of a perovskite type.

The maximum value of y was approximately 0.2, more specifically 0.24, as far as it was confirmed by the results of Examples 1 to 3 and others. However, from the viewpoint of the thermoelectric performance with the dependency of y taken into consideration, a high thermoelectric performance can fully be expected even if y is 0.5.

The thermoelectric conversion material according to the present invention has a lower thermal conductivity than that of a conventional thermoelectric conversion material and therefore is useful for reliably obtaining the temperature difference between a hot area and a cold area in a thermoelectric conversion element.

The present invention may be embodied in other forms without departing from the spirit or essential characteristics thereof. The embodiments described in this specification are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A thermoelectric conversion material composed of an oxide material represented by chemical formula $A_{0.8-1.2}Ta_2O_{6-y}$ (where A is calcium alone or calcium and at least one selected from magnesium, strontium, and barium, and y is larger than 0 but does not exceed 0.5 ($0<y\leq0.5$)).

2. The thermoelectric conversion material according to claim 1, wherein the oxide material is a single crystal.

3. The thermoelectric conversion material according to claim 1, wherein the oxide material is polycrystalline.

4. The thermoelectric conversion material according to claim 1, wherein the oxide material is represented by $CaTa_2O_{6-y}$.

5. The thermoelectric conversion material according to claim 1, wherein the oxide material is represented by $Ca_{0.9}Sr_{0.1}Ta_2O_{6-y}$.

6. The thermoelectric conversion material according to claim 1, wherein the oxide material is represented by $Ca_{0.9}Ba_{0.1}Ta_2O_{6-y}$.

7. The thermoelectric conversion material according to claim 1, wherein the oxide material is represented by $Ca_{0.9}Mg_{0.1}Ta_2O_{6-y}$.

8. A thermoelectric conversion element comprising a thermoelectric conversion material according to claim 1 as an n-type thermoelectric conversion material.

9. The thermoelectric conversion element according to claim 8, comprising:
   a plurality of the n-type thermoelectric conversion materials, and
   a plurality of p-type thermoelectric conversion materials,
   wherein the n-type thermoelectric conversion materials and the p-type thermoelectric conversion materials are disposed on the same plane, and
   the n-type thermoelectric conversion materials and the p-type thermoelectric conversion materials are connected alternately to one another electrically in series.

* * * * *